United States Patent
Kuratli et al.

(10) Patent No.: US 12,456,974 B2
(45) Date of Patent: Oct. 28, 2025

(54) SOFT SWITCHING DEVICE, ELECTRONIC SYSTEM WITH SOFT SWITCHING DEVICE WITH AN ELECTRICAL POWER SOURCE

(71) Applicant: EM Microelectronic-Marin SA, Marin (CH)

(72) Inventors: Christoph Kuratli, La Neuveville (CH); Lubomir Plavec, Brno (CZ)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 18/337,711

(22) Filed: Jun. 20, 2023

(65) Prior Publication Data

US 2024/0007099 A1 Jan. 4, 2024

(30) Foreign Application Priority Data

Jul. 4, 2022 (EP) ..................................... 22182909

(51) Int. Cl.
*H03K 17/16* (2006.01)
(52) U.S. Cl.
CPC ................................. *H03K 17/166* (2013.01)
(58) Field of Classification Search
CPC .................................................. H03K 17/166
See application file for complete search history.

(56) References Cited

U.S. PATENT DOCUMENTS

| | | | |
|---|---|---|---|
| 2005/0068059 A1* | 3/2005 | Takahashi | H03K 19/0016 326/16 |
| 2009/0121774 A1 | 5/2009 | Dathe et al. | |
| 2012/0056655 A1 | 3/2012 | Brauer et al. | |
| 2014/0203846 A1 | 7/2014 | Janschitz et al. | |
| 2018/0024761 A1* | 1/2018 | Meinerzhagen | G11C 5/148 713/323 |

FOREIGN PATENT DOCUMENTS

WO 95/024076 A1 9/1995

OTHER PUBLICATIONS

European Search Report for EP 22 18 2909 dated Dec. 2, 2022.

* cited by examiner

*Primary Examiner* — Menatoallah Youssef
*Assistant Examiner* — Colleen J O Toole
(74) *Attorney, Agent, or Firm* — Sughrue Mion, PLLC

(57) ABSTRACT

A soft switching device (sw) for connecting a power supply to at least one large electronic unit of an electronic system (1), so as to be activated via the soft switching device to the power supply. The device comprises a switch component (M1) with a control terminal and a current source (13) connected to the control terminal to control the switch component closure when the current source is activated. The soft switching device also includes a soft transition element (C1) of capacitive type between the output terminal (12) and the control terminal of the switch component (M1) so as to gradually close the switch for connection to a power supply.

11 Claims, 4 Drawing Sheets

SOFT SWITCHING DEVICE, ELECTRONIC SYSTEM WITH SOFT SWITCHING DEVICE WITH AN ELECTRICAL POWER SOURCE

CROSS REFERENCE TO RELATED APPLICATIONS

The present application is based on, and claims priority from the prior European Patent Application No. 22182909.6, filed on Jul. 4, 2022, the entire contents of which are incorporated herein by reference.

TECHNICAL FIELD

The present invention concerns a soft switching device for an electronic system on chip with an optimization of the electrical power supply of the system and its components.

The present invention also concerns chip-based electronic systems having at least one soft-switching device at a power source.

STATE OF THE ART

The electronic system may include several electronic units of different technical functions and size, such as data processing or signal (CPU and ROM) units, storage of information or data, or radio frequency signal communication parts. These electronic units generally include a large number of components, such as MOS transistors for example, which, by their nature, together represent a large capacitor in the idle state.

As can be seen schematically on FIGS. 1a and 1b of the prior art, the electronic system may be powered through a power source that can provide a VDD voltage to various electronic units to be activated in the electronic system. It is noted that a particular difficulty is to handle multi domain power switching ("power gating") to safe current without creating system mal function due to sudden supply dips. The power supply is generally composed of a basic voltage source Vs and a series output resistance Rs, and usually in parallel a Cvdd decoupling capacitor. Under these conditions, if the electronic units are supplied directly on the VDD supply voltage via a simple switch sw_a, undesired transient VDD voltage drop may occur by transferring charge to a C2 output capacitor of at least one electronic unit to be activated. Depending on the size of the Cvdd and C2 capacitors, the voltage dip may drop below a reset threshold, which can cause problems with the operation of the electronics. This process is very fast, limited only by switch resistance and capacitor values (time constant=Rswitch×(Cvdd+C2)). Charging VDD back to the initial value happens slower. The time constant in this case is defined by the function: Rs×(Cvdd+C2).

The transient supply drops of the VDD voltage source of the electronic system causes on the one hand a system reset when VDD passes below a critical reset threshold (represented by the interrupted line). There is also a delay after this reset until the supply VDD2 settles back close to the desired value Vs.

It should also be noted that the aim is to supply the electronic system with a continuous voltage level and trying not to have any noticeable variation. In addition, if we are looking to build a chip-based electronic system with a voltage regulator without an external decoupling capacitor, it is a challenge to properly supply some or all electronic units of the electronic system at once instantaneously with minimized supply drops.

The electronic system-on-chip (SOC) is aimed to be optimized in power with a voltage regulator that can be fully integrated, in particular to supply a central processing unit (CPU). Preferably, it should be possible to use a voltage regulator at the power input of the electronic system without requiring an external decoupling capacitor, in order to save manufacturing costs and allow miniaturization in this type of application.

Optimization of the electrical power supply to the electronic system must in principle be carried out for the proper functioning of the electronic system in general, as is the case for the present invention described below.

SUMMARY OF THE INVENTION

In order to overcome the disadvantages of the electronic system of the state of the art, the idea of the present invention is to carry out a voltage supply of one or several units of the electronic system progressively over time. This means that the voltage supply on the different units is not applied immediately, but rather with a supply voltage ramp defined in such a way as to avoid excessive sudden transfer of charge from the supply voltage source. Each electronic unit is fed to the supply voltage in a progressive manner through a layout of at least one soft switching device. This ensures that no voltage variation is too big at the start of each unit of the electronic system due to sudden transient charge transfers.

Thus, the present invention concerns a soft-switching device for an electronic system on a chip, which includes the features defined in independent claim 1.

Specific forms of construction of the soft switching device are defined in the claims.

The present invention also relates to the chip-based electronic system having at least a device with soft switching to a power source, which includes the features defined in independent claim 7.

Specific forms of implementation of the electronic chip system are defined in the claims.

One advantage of the present invention is that instead of simply connecting the electronic system at once to a defined supply voltage, it is intended to provide the supply voltage in a controlled manner to each unit to be activated gradually over time and according to a ramp of a defined slope. It is therefore provided for at least one soft switching device to activate at least one electronic unit of the system. The soft switching device essentially consists of a transistor, which is preferably a MOS-type transistor, to act as a switch. The source terminal of the transistor is connected to the power supply from a power source or output from a voltage regulator. The transistor drain is connected to a switch or switch output terminal. The transistor gate is connected to a current source being part of an activation circuit to close the switch, which means is to make the MOS transistor conducting between the source and the drain. In addition, a filter element is provided between the drain and the gate terminal in order to make the MOS transistor gently conductive when activated. The filtering element is preferably a capacitor connected between the drain and the gate of the said MOS transistor.

It can also be advantageously conceived to engage successively each unit of the electronic system one after the other through a set of soft switching devices. This means that in a predefined order of activation of each unit, a first unit is first supplied with this supply voltage and then a second unit is engaged and so on to the last unit of the electronic system. To do this, the electronic system consists of a set of successive switching devices each connected to a unit of the electronic system. However, the waiting time for all units to be activated may be relatively long and thus inefficient.

Advantageously, it can be imagined to engage the different electronic units of the electronic system by a combination on the one hand of the increase of the supply voltage according to a ramp with defined slope and on the other hand a successive engagement of the different units of the electronic system in a predefined order.

Preferably, a control unit of the electronic system is always supplied with voltage as soon as the general supply to the electronic system is present. This control unit can immediately or successively apply the supply voltage for the different electronic units by means of the soft switching devices.

BRIEF DESCRIPTION OF THE FIGURES

The goals, benefits and features of the soft switching device and the electronic system comprising it, and the electrical power supply process of the electronic system will best appear in the following description of at least one form of execution illustrated by the drawings on which.

DETAILED DESCRIPTION OF THE INVENTION

In the following description, all components used for the electronic system to at least one soft-switching device for the power supply of at least one electronic unit of the system according to the invention, which are well known to the skilled person in this technical field will be reported only in a simplified manner.

Figure 2A:
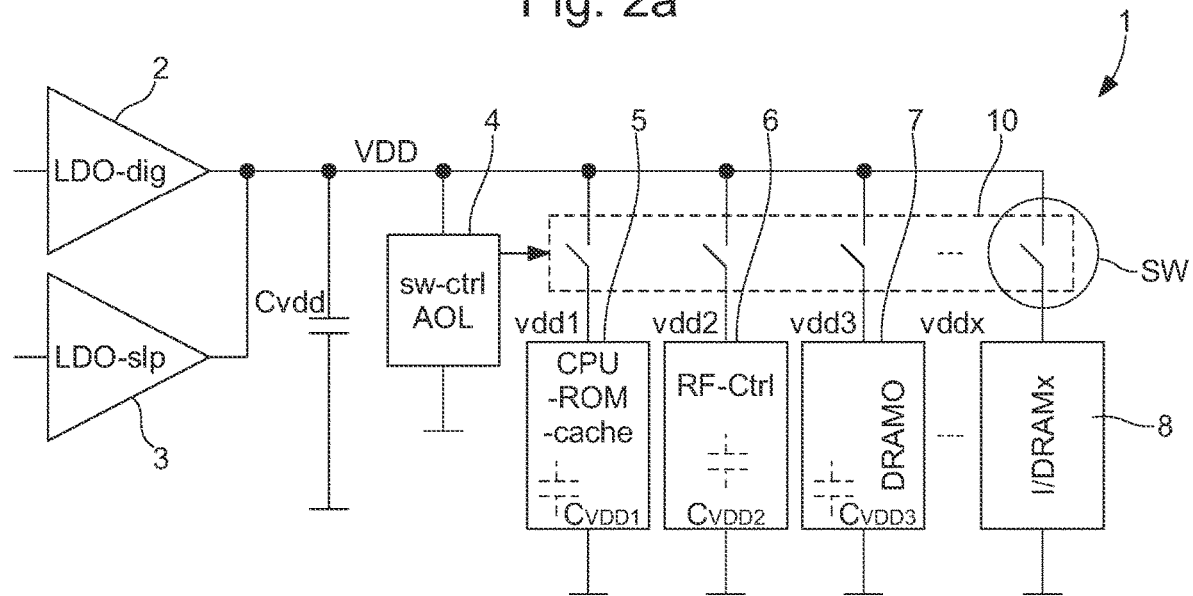
FIGS. 2a and 2b represent a form of execution of the electronic system of the present invention with FIG. 2a with several electronic units which may be activated when the system is supplied by at least one soft switching, and in FIG. 2b the electrical signals for the input and output of the electronic system.

FIG. 2a represents a form of execution of the electronic system 1 with at least one soft switching device sw through which a progressive power supply is provided to at least one electronic unit 5, 6, 7, 8 of the electronic system 1 in such a way as to allow its activation and without disturbance. The electronic system 1 can still include at least one input voltage regulator 2, which can be a digital voltage regulator. An additional voltage regulator 3 may still be provided, such as an additional voltage regulator of a rest mode. When using one or both regulators, the first digital voltage regulator 2 provides at least one VDD supply voltage at a voltage level of for example 0.9 V, while the second digital voltage regulator 3 provides at least one low supply voltage, for example at a level of 0.63 V for a rest mode.

The electronic system 1 still includes a Cvdd capacitor at the output of the voltage regulators 2, 3 and an AOL (always-on-logic) control unit 4 for the soft switching devices sw and/or one or more electronic units 5, 6, 7, 8 of the electronic system 1. The AOL control unit 4 enables the soft switching device sw or a set 10 of soft switching devices to be controlled and each connected to an electronic unit 5, 6, 7, 8 of the electronic system 1. This AOL control unit 4 is always activated as soon as the electronic system 1 is powered on, as well as the second low voltage regulator 3 in a rest mode. The decoupling capacitor Cvdd accumulates a supply voltage close to the VDD voltage so as to supply parts of the electronic system 1 if the supply voltage is for example less than 0.9 V.

Each electronic unit 5, 6, 7, 8 can be connected to its own or individual soft switching device sw so that it can control the activation of each electronic unit independently of each other. It may therefore be preferable to activate according to a predetermined selection each electronic unit successively one after the other or several electronic units at the same time. However, for each electronic unit to activate the supply voltage must progress on a determined ramp or slew-rate so as not to cause problems with current spikes or to place the electronic system in the reset phase.

Figure 2B:
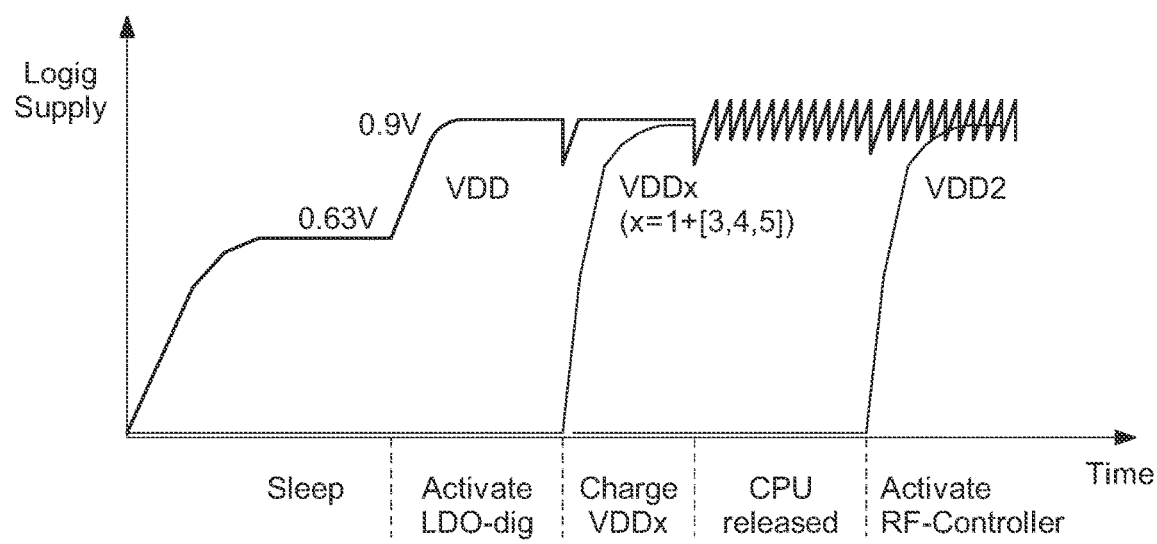

As shown in FIG. 2b, in a rest mode the second low voltage digital regulator 3 provides a supply voltage at 0.63 V to power the AOL control unit 4. Upon activation of the first digital regulator 2 by the AOL, the supply voltage VDD increases to a value close to 0.9 V. After a certain of time, the AOL control unit activates one or more electronic units 5, 6, 7, 8, which can be large, by asserting the control signals of the corresponding soft-switches devices. Note the progression of the supply voltage according to a ramp determined as it will be explained in reference to the following FIG. 3.

It should be noted that the electronic units activated by the relatively slow progression of the supply voltage is beneficial for the entire electronic system 1. According to the timing diagram of different signals in FIG. 2b, after activation of the first LDO voltage regulator, there is a command to activate several memory units (I/DRAM) in connection with the released CPU processing unit. Finally, another unit for RF radio frequency signal communication can still be activated for a certain (short) period of time. After activations of several electronic units in defined periods of time, the electronic system 1 returns to a resting position with only the second voltage regulator 3 and the AOL control unit 4.

Figure 1A:
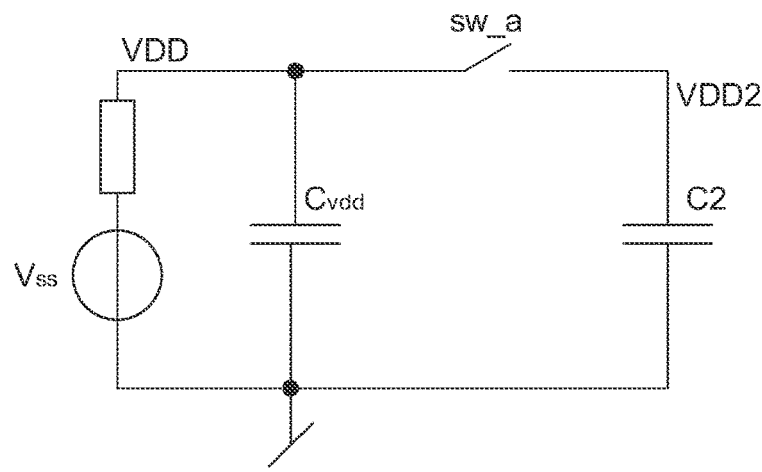
FIGS. 1a and 1b represent a very simplified arrangement of the prior art of the electronic system including a traditional switch and a graphical representation of the signals following the immediate supply of the electronic system.
Figure 1B:
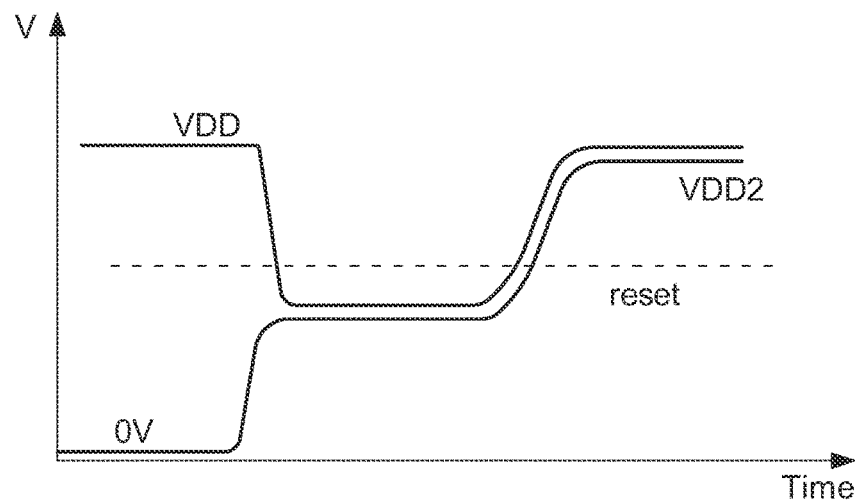
Figure 3:
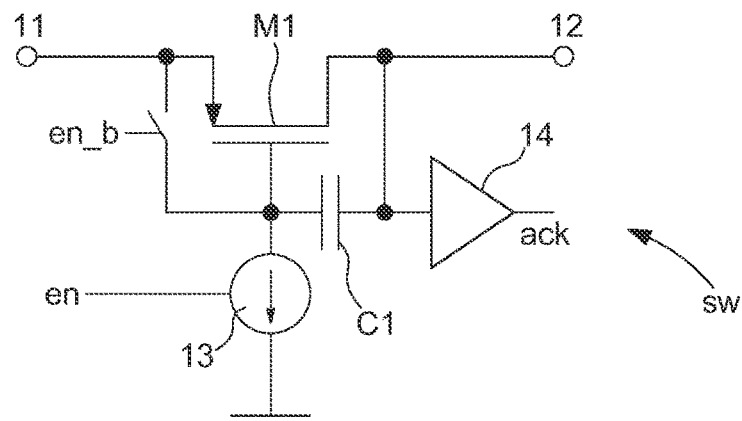
FIG. 3 is a generic form of execution of the soft switching device for an electronic system according to this invention, and FIGS. 4a and 4b first represent a detailed form of execution of the soft switching device shown in FIG. 3, and in FIG. 4b the different component control signals of at least one electronic unit to be activated from the electronic system with the power supply.

FIG. 3 represents a generic form of execution of the soft switching device sw for an electronic system. FIG. 3 describes the main components of the soft switching device sw. This device includes a switch component M1 with a control terminal to control the closing between an input terminal 11 and an output terminal 12 in a first state and the opening in a second state of the switch. The soft switching device also includes a current source 13, which can be activated by an activation signal en.

The input terminal 11 of the switch component M1 receives the VDD supply voltage. A current source 13 is connected to the control terminal of the switch component M1 in a way that the switch turns on when activating the current source. The VDD supply voltage is supplied progressively to the output terminal 12 of the switch M1. To do this, the soft switching device still includes a soft transition element of capacitive type C1 connected between the output terminal 12 and the switch control terminal M1. In this configuration with the soft transition element C1, it allows a progressive transmission of the VDD supply voltage through the switch M1.

The soft transition element C1 can advantageously be a capacitor C1, while the switch component in this form of execution can be a transistor of type MOS. In the design described, the switch component is at least one PMOS transistor with the source terminal connected directly to input terminal 11, the drain terminal connected directly to output terminal 12, and the control terminal (gate terminal) connected to the current source, which pulls down the gate of M1 to the 0 V terminal of the VDD supply voltage source in a smooth way thanks to the filter capacitor C1. Thus the transistor PMOS M1 is gently rendered conductive to supply voltage progressively to an electronic unit of the electronic system.

For controlling the switch component M1, a set 14 of comparison and logical components is still provided in the soft switching device to take note ack of the progressive power supply of at least one electronic unit to be activated from the electronic system. Once the power supply is applied to the electronic unit and at the end of its operation, a reverse activation signal en_b disconnects the current source 13 to return to an off mode.

Figure 4A:
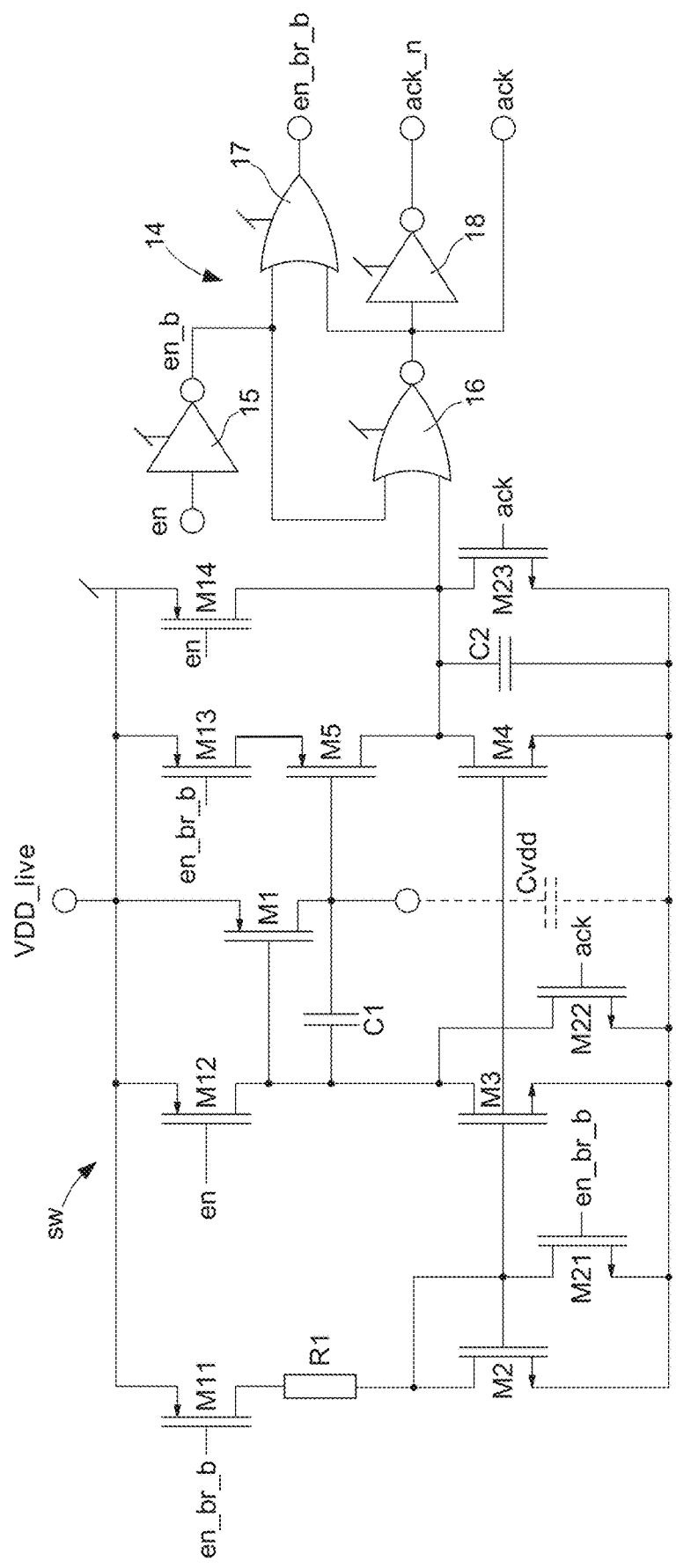

FIG. 4a shows in more details the soft switching device shown in FIG. 3. A first part of FIG. 4a refers to the generation of power sources to generate bias currents for the slew-rate control and for the output level detector, a second intermediate part refers to the progressive supply of the supply voltage through the switch component, which in this case a PMOS transistor M1. Finally, the third part is relative to a set 14 of comparison and logical components, which is a switch control unit, and is still provided in the soft switching device to become the acquainted ack (acknowledge) signal to indicate sufficient supply. In said third part, there are processes, which are the switch request (enable/disable), turns-on/off local biasing, and provides an acknowledge signal ack when the output voltage reached sufficient level.

Upon the request from the system and the AOL control unit to turn-on the soft switching device sw normally by a signal "en" goes to logic "1", the local bias generator (first part of the device) is activated and provides a gate charging current to the main switch M1 through a biasing transistor M3. The main switch is a PMOS transistor M1 in this embodiment.

It is to be noted that there is the generation of the signal ack by the soft switching device sw. This signal ack can be used by the AOL control unit to know the supply of the local domain is present.

When the gate voltage on the transistor PMOS M1 reaches the threshold for which the switch starts to conduct, in turn starts to rise the output voltage "Vdd_virtual". However, the rising will generate a local feedback current through the capacitor C1, taking away current from the bias and stops charging the gate. As a result the output voltage rises steadily with a slew-rate (SR=dV/dt) set by the bias current and the feedback capacitor C1. The controlled slew-rate of the output voltage in turn limits the peak-current in the switching device M1 to Idd_pk=CVDD×SR, which is set to a level that can be handled easily by first digital voltage regulator 2 (LDO dig).

The output voltage detector is implemented using a low threshold Vth (LVT) PMOS transistor M5 and a bias current provided through the transistor NMOS M4. When the output reaches the threshold of the LVT device, its drain current goes to zero, and M4 pulls the drain of M5 to ground. With a delay set by the bias current and capacitor C2, this indicates that the switch has turned on and can be acknowledged by asserting "ack" to '1'.

Regarding the first part of local bias current source generation, it is represented by an NMOS transistor M2 connected to a resistor R1 and turned on through switch M11 when signal en_br_b is set to '0'. The generated bias current is determined by (VDD_live−Vth of M2)/R1. The gate terminal of the switch transistor M11 receives a reverse activation signal en_br_b to make transistor M11 a conductor, that is, with a voltage in the direction of ground at 0 V. The other side of the resistor R1 is connected to a drain and a gate of a first NMOS transistor M2, while the source of this first NMOS transistor M2 is connected directly to the ground terminal 0 V. A second NMOS transistor M3 has its gate connected to the gate of the first transistor M2 and its source connected to the ground terminal 0 V. If the first and second transistors M2 and M3 are of identical size, the current in the first transistor M2 is the same as the mirror current in the second transistor M3 especially at the beginning of the generation of current sources. The drain of the second transistor M3 is connected on the one hand to the gate of the transistor switch M1, to the drain of a second PMOS transistor M12, and on the first side of the capacitive soft transition element C1. The source of the second PMOS transistor M12 is connected to the supply voltage terminal VDD_live, and the gate of this transistor M12 is controlled by an activation signal at 0 V. The switch transistor M1 has its source connected to the supply voltage VDD_live and its drain connected on the other side to the soft transition element of capacitive type C1 to a terminal Cvdd, and to the gate terminal of a third PMOS transistor M5.

A third current source NMOS transistor M4 is connected through its gate to the gate of the first and second NMOS transistors M2 and M3, and its ground source at 0 V. The drain of the third transistor M4 is connected to the drain of the third PMOS transistor M5 and to one side of a second charge storage capacitor C2, the other side of which is connected to the ground terminal. A fourth switch PMOS M13 transistor is arranged in series between the third M5 transistor and the supply voltage terminal VDD_live. The source of the fourth M13 transistor is connected to the supply voltage VDD_live and its drain connected to the source of the third M5 transistor, and the gate of this fourth M13 transistor is controlled by a reverse activation signal en_br_b to make it conductive as the first transistor M11.

A fourth NMOS transistor M21 has a drain connected to the drain and gate of the first transistor M2, and a source connected to the ground terminal 0 V. This transistor M21 is used to cut the current sources by a reverse activation signal en_br_b provided to its gate. A fifth NMOS transistor M22 has a drain connected to the drain of the second NMOS transistor M3 and to the drain of the second PMOS transistor M12, and a source connected to the ground terminal at 0 V. This fifth transistor M22 is activated on its gate by the acknowledge signal ack so as to turn it one once the electronic unit is at the required power supply voltage.

In the control unit part, a sixth NMOS transistor M23 is still provided with its source connected to the ground terminal 0 V and its drain connected to a drain of a fifth PMOS transistor M14, one of which is connected to the supply voltage terminal VDD_live. This fifth transistor M14 is activated by an activation signal on its gate, while the sixth M23 transistor is activated by the acknowledge signal ack on its gate. The transistor drains M14 and M23 are also connected to the second charge storage capacitor C2.

The soft switching device sw still has output logic gates. A first logic gate NOR 16 has a first input connected to the second capacitor C2 and a second input connected to an output of a first inverter 15 and a first input of a logic gate OR 17. The exit of the first logic gate 16 and connected on the one hand to an input of a second 18 inverter and a second entrance of the logic gate OR 17. The input of the first inverter receives an activation signal en. The input of the second inverter receives a recognition signal ack and the output of the logic gate OR 17 provides a reverse recognition signal ack_n.

It should also be noted that the comparison and logical components package 14 includes the components M4, M5, M13, M14, M23, C2 and the logic gates 15, 16, 17 and 18.

Figure 4B:
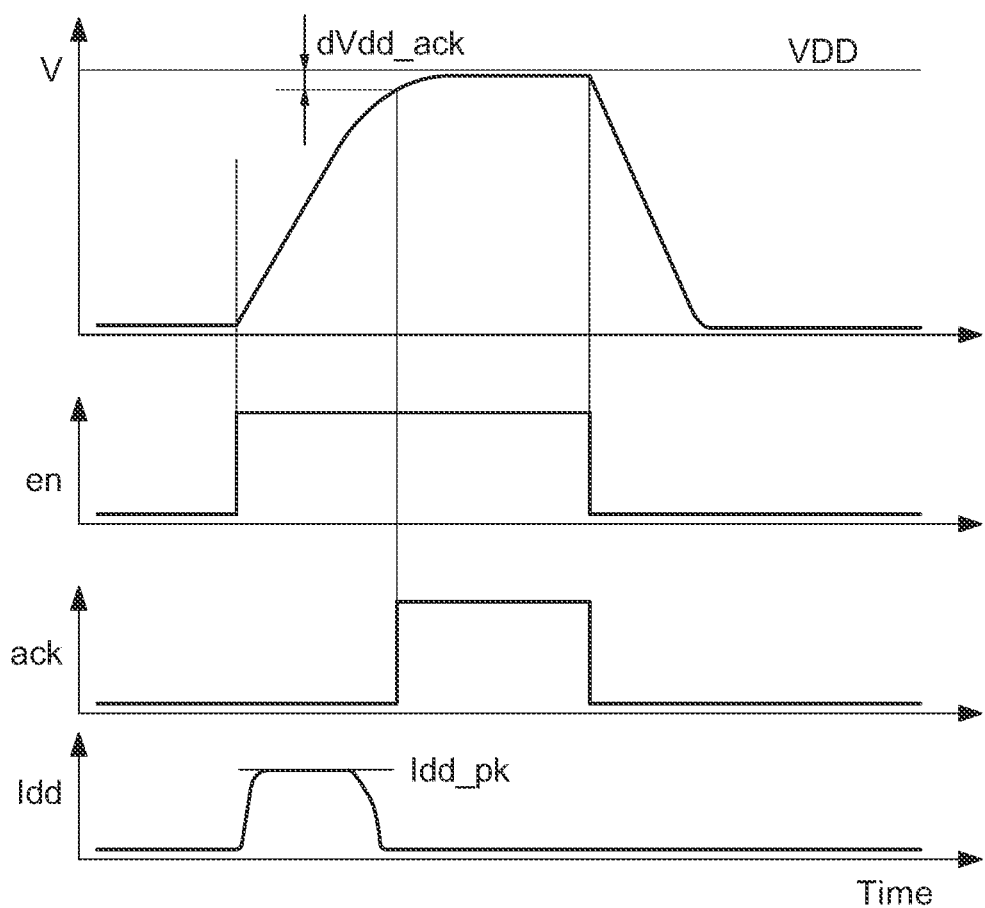

FIG. 4*b* shows different signals on key points in FIG. 4*a*. Note that for an initial period of time all signals are at 0 V, this means that no soft switch activation is yet in operation. When activating an electronic unit of the electronic system, at least one soft switching device must be turned on. To do this the activation signal en goes from '0' to '1' which turns on at least switch M1, current sources M3 and M4, transistors M5, M11 and M13.

During this first phase of transient power supply voltage increase for the electronic unit, the current Idd in the switch M1 is at maximum peak until the acknowledge signal ack goes to state '1' (enabled). Once the electronic unit has to be put to off state mode again after a period of operation, both the activation signal en and the recognition signal ack revert to '0'. The electronic unit returns to a off state position before a new activation.

On the basis of the above description, several variants of the soft switching device and the electronic system comprising it may be designed by the skilled person in the art without falling outside the scope of the invention defined by the claims.

The invention claimed is:

1. A soft switching device for connecting a power supply to at least one electronic unit of an electronic system, so as to be activated via the soft switching device to the power supply, the soft switching device comprising:
   a switch component with a control terminal and a current source connected to the control terminal to control the switch component closure when the current source is activated; and
   a soft transition element of capacitive type between the output terminal and the control terminal of the switch component so as to gradually or progressively close the switch for connection to a power supply,
   wherein a third NMOS current source transistor is connected through its gate to a gate of a first NMOS transistor and a gate of a second NMOS transistor of the current source through a first connection, and its source at 0 V, wherein a drain of the third NMOS transistor is connected to a drain of a third PMOS transistor and to one side of a second charge storage capacitor through a second connection, the other side of which is connected to a ground terminal, and wherein a drain of the switch component is connected to a gate terminal of the third PMOS transistor through a third connection,
   wherein the first connection, the second connection, and the third connection are separate from one another.

2. The soft switching device according to claim 1, wherein the soft transition element of capacitive type is a capacitor connected between the output terminal and the control terminal.

3. The soft switching device according to claim 1, wherein the switch component is a MOS-type transistor.

4. The soft switching device according to claim 1, wherein the switch component is at least one PMOS transistor.

5. The soft switching device according to claim 4, wherein the transistor PMOS is provided in operation to reach a threshold for which the switch starts to conduct, in turn for rising an output voltage and wherein it is provided to generate a local feedback current through the capacitor, taking away current from the bias and to stop charging the gate of the first PMOS transistor, as a result the output voltage rises steadily with a slew-rate SR=dV/dt set by the bias current and the feedback capacitor.

6. An electronic system having at least one soft-switching device at a power source according to claim 1, the electronic system comprising a decoupling capacitor connected to at least one soft switching device (sw), an AOL control unit of the soft switching device (sw) and one or more electronic units to be activated by at least one controlled soft switching device, and wherein the AOL control unit is always activated as soon as the electronic system is powered on.

7. The electronic system according to claim 6, further comprising at least one input digital voltage regulator, and an additional voltage regulator for a rest mode.

8. The electronic system according to claim 7, wherein the first digital voltage regulator provides at least one VDD supply voltage at a level required by standard logic operation, while the second digital voltage regulator provides a low supply voltage to safe power in a rest mode.

9. The electronic system according to claim 6, comprising a set of successive soft switching devices each connected to a unit of the electronic system.

10. The electronic system according to claim 6, wherein each electronic unit is connected to an individual soft switching device to control the activation of each electronic unit separately or independently of each other.

11. The electronic system according to claim 10, wherein each soft switching devices is configured to activate according to a predetermined selection each electronic unit successively one after the other or several electronic units at the same time, and wherein the first PMOS transistor is intended to provide supply voltage to a respective electronic unit of the system with a particular slew-rate SR=dV/dt which can be different from each other.

* * * * *